(12) United States Patent
Smith et al.

(10) Patent No.: US 6,898,134 B2
(45) Date of Patent: May 24, 2005

(54) SYSTEMS AND METHODS FOR SENSING A MEMORY ELEMENT

(75) Inventors: Kenneth Smith, Boise, ID (US); Frederick A. Perner, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/623,357

(22) Filed: Jul. 18, 2003

(65) Prior Publication Data

US 2005/0013182 A1 Jan. 20, 2005

(51) Int. Cl.[7] .................................................. G11C 7/00
(52) U.S. Cl. .................... 365/201; 365/205; 365/189.07
(58) Field of Search ................................ 365/201, 205, 365/189.07

(56) References Cited

U.S. PATENT DOCUMENTS 6,504,779 B2 * 1/2003 Perner ........................ 365/158
6,788,594 B2 * 9/2004 Ware et al. ................. 365/233

* cited by examiner

*Primary Examiner*—Richard Elms
*Assistant Examiner*—Tuan T. Nguyen

(57) ABSTRACT

Methods, systems, and programs for recalibrating a sense amplifier. A representative method includes: measuring a physical property of a memory cell to produce a first measurement; comparing the first measurement to a first range, the first range being indicative of a short or open circuit in the memory cell; halting the sense of the selected memory cell if the first measurement exceeds the first range; comparing the first measurement to a second range, the second range being a predetermined range signifying a recalibration of the sense amplifier may be necessary; proceeding with the sense if the first measurement is within the first range and the second range; repeating the steps of measuring and comparing for a predetermined number of iterations, if after each iteration, the measurement exceeds the second range but is within the first range; and recalibrating the sense amplifier, if after the predetermined number of iterations, the measurement still exceeds the second range but is within the first range.

20 Claims, 6 Drawing Sheets

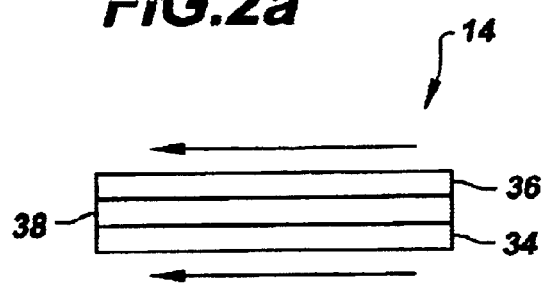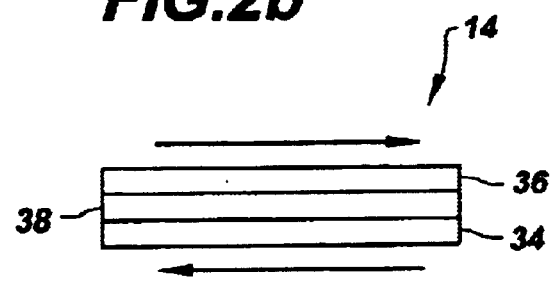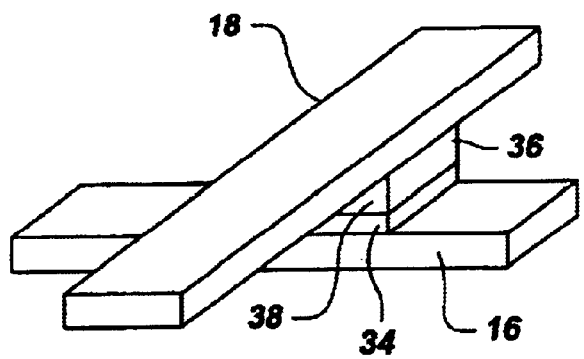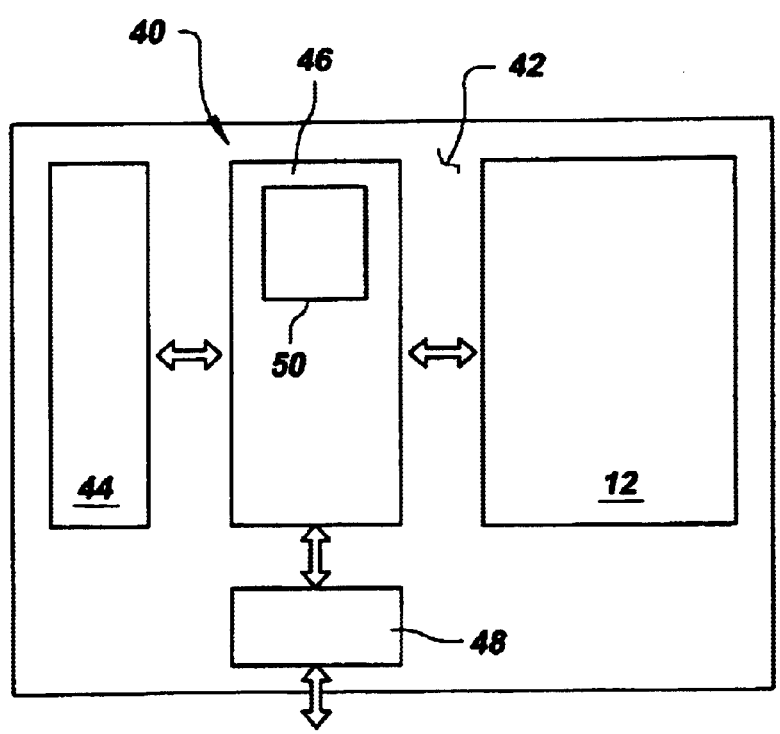

SYSTEMS AND METHODS FOR SENSING A MEMORY ELEMENT

FIELD OF THE DISCLOSURE

The present disclosure relates to data storage and retrieval. In particular, this disclosure relates to systems and methods for efficiently sensing a selected memory cell a resistive cross point memory (RXPtM) cell array, and subsequently recalibrating a sense amplifier during the sense.

BACKGROUND OF THE DISCLOSURE

Magnetic Random Access Memory ("MRAM") is a non-volatile memory that is being considered for long term data storage and is one exemplary type of resistive cross point memory. It is conceivable that other forms of RXPtM's will be developed that are not based on MRAM use, and the methods described in this invention disclosure will apply to those as well. A typical MRAM device includes an array of memory cells. Word lines extend along rows of the memory cells, and bit lines extend along columns of the memory cells. The memory cells are each located at a cross point of a word line and a bit line, and each memory cell includes two masses of magnetic material. One of the masses is magnetically fixed and the other is magnetically variable. A memory cell stores a bit of information as the orientation of relative magnetization of the fixed and variable materials. In other words, the magnetization of the each memory cell at any given time assumes one of two stable orientations. These two stable orientations, referred to as "parallel" and "anti-parallel" magnetic orientation, represent logic values of "0" and "1," for example. The resistance of a memory cell varies dependent upon whether it stores a "0" or a "1" value. That is, the resistance of a memory cell is a first value "R" if the orientation of the magnetization of the fixed magnetic material and of the variable magnetic material is parallel, and the resistance of the memory cell is increased to a second value R+ΔR if the orientation of the magnetization is anti-parallel. The orientation of the relative magnetization of a selected memory cell (and, therefore, the logic state of the memory cell) may be sensed by sensing the resistance value of the selected memory cell.

Performing sense and write operations in MRAM devices could be orders of magnitude faster than performing sense and write operations in conventional long term storage devices, such as hard drives, for example. In addition, the MRAM devices could be more compact and could consume less power than hard drives and other such conventional long term data storage devices.

However, sensing the resistance state of a single memory cell in an array (and thereby "sensing" the data value) can be unreliable. All memory cells in the array are coupled together through many parallel paths (i.e., the bit and word lines). The resistance seen at one cross point equals the resistance of the memory cell at that cross point in parallel with resistances of memory cells in the other rows and columns (again, the array of memory cells may be characterized as a cross point resistor network).

There is a need to reliably sense the resistance states of memory cells in MRAM devices.

Currently, it is known to use a sense amplifier to sense a resistance value associated with a selected memory cell of an array. However, determining when the sense amplifier has an acceptable calibration or needs to be recalibrated is conventionally performed off of the chip on which the array of memory cells is fabricated. Further, conventional methods of determining when a new sense amplifier recalibration is required and performing that recalibration destroys data in a memory cell. In essence, calibration of such a sense amplifier is a laboratory procedure.

Further, calibration of a sense amplifier so that it can reliably perform this sense operation compensates at the same time for two aspects of the RXPtM array. These two aspects may be considered as "global" and "environmental." That is, the sense amplifier is compensated or calibrated for global factors of the memory cell array that are constant over time. These global factors include such influences as process and geometry variations (i.e., asymmetries in the circuit design and fabrication non-uniformity resulting in threshold voltage variations and resistance and capacitance variations, for example) that occur during fabrication of the memory cell array. At the same time, the environmental factors then existing for the RXPtM array are compensated for. However, compensation for the global factors which are constant over time does not address needed compensations for environmental parameters which change over time. These environmental parameters include such factors as operating temperature of the RXPtM array, and power supply voltage variations.

Thus, there is a need to provide a method to determine when recalibration of sense amplifier offset (i.e., calibration) values is necessary for reliably sensing stored data values in a RXPtM.

Further, there is a need for providing a method to determine when recalibration of a sense amplifier is needed before data is lost because of an amplifier "out of calibration" condition.

Also, there is a need for such a sense amplifier recalibration to be performed without loss of data stored in a RXPtM array.

Still further, there is a need to have such a method and apparatus implemented on the same chip as the RXPtM cell array.

SUMMARY OF THE DISCLOSURE

Systems and methods for sensing a memory element and subsequently recalibrating a sense amplifier are disclosed. The sense amplifiers are subject to a variety of process and operating variations, whereby recalibrating prior to fully performing the sense is a viable solution. Recalibration, however, need not always apply, and may be quite costly with regard to operation time of the sense. Methods disclosed herein substantially improve the overall performance of a sense amplifier by recalibrating the sense amplifier, only when necessary.

In this regard, a representative method for efficiently recalibrating a sense amplifier includes: measuring a physical property of a selected memory cell to produce a first measurement; comparing the first measurement to a first range, wherein the first range is indicative of a short circuit or an open in the selected memory cell; halting the sense of the selected memory cell if the first measurement exceeds the first range; comparing the first measurement to a second range, wherein the second range is a predetermined range signifying a recalibration of the sense amplifier may be necessary; proceeding with the sense if the first measurement is within the first range and the second range; repeating the steps of measuring and comparing for a predetermined number of iterations, if after each iteration, the measurement exceeds the second range but is within the first range; and recalibrating the sense amplifier, if after the predetermined number of iterations, the measurement still exceeds the second range but is within the first range.

The method may also be construed as a method for efficiently testing for needed recalibration of a sense amplifier during a sense of a resistance value of a selected memory cell. This method includes: defining an average time value, which is indicative of averaged time values for each of a selected set of memory cells, while the resistance of each cell of the selected set of cells is connected in series with a selected pre-charged capacitance, and with present operating parameters of the memory cell array applying; determining a time value, which is indicative of the discharge time of the selected capacitance upon connection to the resistance of the selected memory cell; calculating a difference value by comparing the time value to the average time value; halting the sense of the selected memory cell if the difference value exceeds a first range; redetermining the time value and recalculating the difference value if the difference value is within the first range but exceeds a second range; recalibrating the sense amplifier if the recalculated difference value still exceeds the second range; and proceeding with the sense operation if the difference value or the recalculated difference value is within the second range.

Yet another method may be construed as a method for increasing the quality of sensing during a read on a memory cell. This method comprises: sensing a parameter of the memory cell; comparing the parameter to a threshold to determine whether the parameter is valid; enabling a sensing procedure upon determining the parameter is valid; and enabling a response procedure upon determining the parameter is not valid.

A representative system for sensing a state of a memory cell is also disclosed. The system includes means for sensing a parameter of the memory element and means for comparing the parameter to a first range to determine whether the parameter is valid. The system also includes means for performing a sensing procedure upon determining the parameter is valid and means for performing a response procedure upon determining the parameter is not valid.

A program for sensing a state of a memory element is also disclosed. The program, being stored on a computer-readable medium, includes logic configured to enable sensing of a parameter of the memory element, logic configured to compare the parameter to a first range and second range to determine whether the parameter is valid, and logic configured to enable a sensing procedure upon determining the parameter is valid. The program also includes logic configured to re-enable sensing of the parameter of the memory element upon determining the parameter is invalid and logic configured to facilitate recalibration of sensing equipment configured to perform the sensing, upon re-sensing the parameter for a predetermined number of iterations.

BRIEF DESCRIPTION OF THE DRAWINGS

FIGS. 2a and 2b are illustrations of parallel and anti-parallel magnetization orientations of a typical MRAM memory cell.

FIG. 3 is an illustration of an MRAM memory cell that has been selected during a sensing step.

FIG. 4 is a more particularized illustration of a memory chip including a memory cell array, an amplifier array, and an I/O controller, all on a single chip.

DETAILED DESCRIPTION

The present methods and systems are most preferably embodied in an magnetic random access memory (MRAM) device, which includes a memory cell array, a sense amplifier array, and an input/output (I/O) controller, all on a single chip. That is, the elements of the memory cell array, of the sense amplifier array, and of the I/O controller are all formed on the same chip. Further, the I/O controller includes an amplifier calibration controller, which is responsible for carrying out the amplifier recalibration evaluation process with respect to each memory cell of the array before data is sensed from that particular cell. Thus, data stored in cells of the array is never compromised or destroyed by an attempt to sense the data with a sense amplifier that is out of calibration with respect to global or environmental conditions of the RXPtM array. Environmental conditions of the RXPtM array, which change with time, are compensated for by recalibration of the sense amplifier before they can have a detrimental effect on the reliability of data retrieval from the cells of the array.

Commonly assigned U.S. Pat. No. 6,504,779 is incorporated by reference in its entirety U.S. Pat. No. 6,504,779 illustrates a method and apparatus for testing for acceptable calibration of a sense amplifier which is utilized in sensing the resistance value of a memory cell and sensing a stored data value from a memory cell, and for initiating recalibration of the sense amplifier, when needed, all without destroying data stored in the memory cell.

Figure 1:
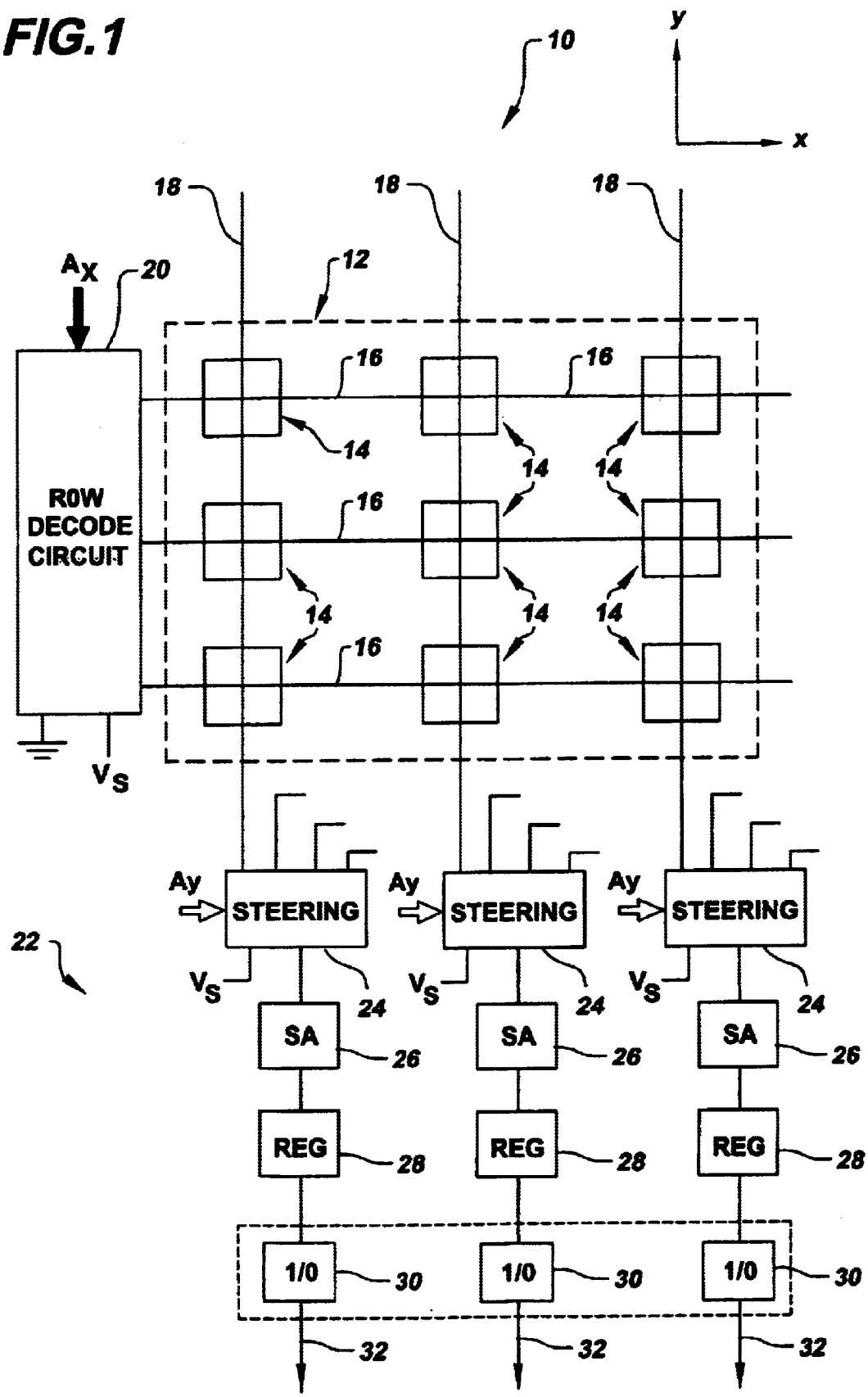
FIG. 1 is a generalized schematic illustration of an MRAM memory cell array according to the present invention.

Specifically U.S. Pat. No. 6,504,779 illustrates a method and apparatus that initiates recalibration, if necessary, after comparing a measure physicial property of the particular memory cell with a pre-determined range. If the measured physical property is within the range, the read operation may proceed. If not, the sense amplifiers may then be recalibrated. Reference is now made to FIG. 1, which schematically illustrates an MRAM device 10 including an array 12 of memory cells 14. The memory cells 14 are arranged in rows and columns on the array, with the rows extending along an x-direction and the columns extending along a y-direction. Only a relatively small number of memory cells 12 are shown in FIG. 1 in order to simplify the description of the invention. In practice, arrays of any size may be used.

Conductive traces functioning as word lines 16 extend along the x-direction in a plane of the memory cell array 10. Other conductive traces functioning as bit lines 18 extend along the y-direction in a plane of the memory cell array 10. There may be one word line 16 for each row of the array 10 and one bit line 18 for each column of the array 10. Each memory cell 14 is located at a cross point of a corresponding word line 16 and bit line 18, hence the name "resistive cross point memory" cell array, or RXPtM.

The memory cells 14 are not limited to any particular type of device. For example the memory cells 14 may be fabricated to utilize spin dependent tunneling ("SDT") junction devices. However, the resistance value of each of the memory cells 14 is dependent upon the value (i.e., 1 or 0) of a data bit stored in the particular cell.

Further considering FIG. 1, the RXPtM cell array 10 also includes a row decode circuit 20. During sense operations, the row decode circuit 20 may apply either a constant supply voltage Vs or a ground potential to selected ones of the word lines 16. The constant supply voltage Vs may be provided by an external circuit.

The RXPtM cell array 10 further includes a sense amplifier circuit for sensing the resistance of selected memory cells 14 during sense operations, and a write circuit for amplifier circuit is indicated generally at 22. The write circuit is not shown in order to simplify the explanation of the present invention.

The sense amplifier circuit 22 includes a plurality of steering circuits 24 and sense amplifiers 26. Also, this circuit 22 preferably includes an analog-to-digital converter, including an integrator, a comparator, and a pre-settable counter (which sub-components are not individually indicated on drawing FIG. 1). Multiple bit lines 18 are connected to each steering circuit 24. Each steering circuit 24 includes a set of switches that connect each bit line 18 to either a source of operating potential or to a sense amplifier 26. An output of the sense amplifier 26 is supplied to a data register 28, which, in turn, is coupled via an I/O controller circuit 30 to an output (indicated by arrowed numeral 32) of the MRAM device 10. The I/O controller 30 controls the entire MRAM device 10 (hence, the dashed box encompassing sub-parts of I/O controller 30 in FIG. 1, to be further described below), and the outputs 32 may be common to one another (i.e., via a shared data I/O port, for example).

Referring now to FIGS. 2a and 2b, a typical SDT junction memory cell 14 includes a magnetic layer 34 of "pinned" or fixed magnetic orientation. The layer 34 has a magnetization that is oriented in the plane of the pinned layer 34, and which is fixed in a selected direction in this plane so as not to change orientation in the presence of an applied magnetic field having a magnitude within a range of interest. The SDT junction device 14 also includes a "free" layer 36 having an orientation of magnetization that is not pinned. Rather, the magnetization of the layer 36 can be selectively oriented in either of two directions both lying in the plane of the layer 36. If the magnetization of the free and pinned layers 34 and 36 are generally in the same direction, the orientation is said to be "parallel" (again, as is indicated by the arrows in FIG. 2a). If the magnetization of the free and pinned 34 and 36 layers are generally in opposite directions (viewing FIG. 2b), then the orientation is said to be "anti-parallel." The magnetization in the free layer 36 may be selectively oriented by applying write currents to word and bit lines 16 and 18 that cross the memory cell 14.

The free and pinned layers 34 and 36 are separated by an insulating tunnel barrier 38. The insulating tunnel barrier 38 allows quantum mechanical tunneling to occur between the free and pinned layers 34 and 35. This tunneling phenomenon is electron spin dependent, making the resistance of the SDT junction device 14 a function of the relative orientations of the magnetization of the free and pinned layers 34 and 36. Again, the resistance of a SDT junction device 14 will have a first value R if the orientation of magnetization of the free and pinned layers 34 and 36 is parallel, and will have a second value R+ΔR if the orientation of magnetization is anti-parallel.

Referring to FIG. 3, a selected memory cell 14 is illustrated during a sense operation. During the write operation which stored a data value in the memory cell 14, the magnetization in the free layer 36 of the selected memory cell 14 was oriented by applying the currents to both the word line 16 and bit line 18 crossing that memory cell 14. Applying the currents to the word line 16 and bit line 18 caused the magnetization of the free layer 36 to rotate to a selected one of the parallel orientation or to the anti-parallel orientation. Thus, a resistance value (i.e., R, or R+ΔR) between the lines 16 and 18 for cell 14 is associated with the stored data value.

FIG. 4 illustrates a MRAM memory chip 40 in accordance with embodiments of the present invention. Viewing FIG. 4, it is seen that the MRAM chip includes a substrate 42 upon which the MRAM device 10 including the array 12 of cells is formed. Also formed on this same substrate 42 is a sense amplifier array 44, which includes a plurality of sense amplifiers 26, recalling the description of FIG. 1 above. Controlling the interface of the array 44 of amplifiers 26, and the array of memory cells 12 is a global controller circuit 46. The global controller circuit 46 include row circuits 20 and column circuits 22, and also moderates communication of data into and from the array 12 via an input/output port 48 (i.e., indicated with the double-headed arrow on FIG. 4). While the global controller circuit 46 includes circuit portions in addition to those described here, it is important to note that this global controller circuit 46 includes a calibration controller 50.

Calibration controller 50 is effective upon each command from global control circuit 46 to sense a data bit (i.e., to sense a relevant resistance value) from a memory cell of the memory cell array 12, to test the calibration of the one of the sense amplifiers of the amplifier array 44 which will effect sensing of the selected memory cell.

Figure 5:
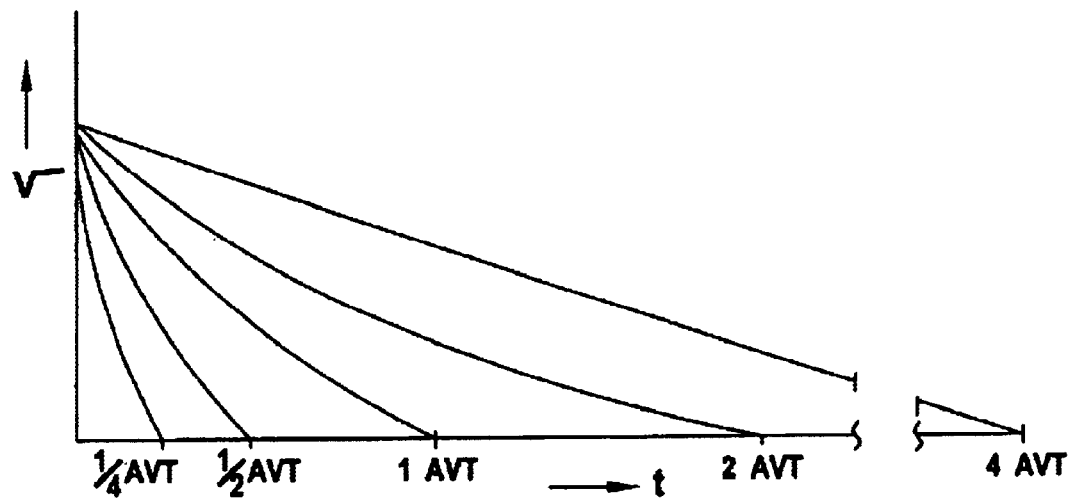
FIG. 5 is a graphical illustration of time values used in testing a memory cell and associated amplifier for proper calibration under then existing environmental conditions.

FIG. 5 depicts a time-versus-voltage relationship that is preferably utilized in order to make a determination as to whether a particular sense amplifier has a correct calibration, and if not, to initiate a calibration of the particular sense amplifier. Considering now FIGS. 5 and 7 in conjunction with one another, it is seen in FIG. 5 that a particular time value is indicated as having a value of "1" and is labeled 1AVT (average time value). The time interval indicated as 1AVT is determined by individually testing (i.e., connecting) memory cells of a selected set of representative memory cells (i.e., representative of the cells of memory cell array 12) with an integrator circuit with the selected memory cell, and a pre-charged integration capacitor, an integrator, a comparator, and a pre-settable counter. The result is that the integration capacitor is discharged over time via the integrator, and the curve of voltage difference between Vdd and the charge level on the capacitance (i.e., in volts) is represented graphically. The time interval for each of the set of memory cells is determined, and the average value of time-versus-voltage is indicated graphically on the graph of FIG. 5. The average value of time-versus-voltage is indicated on the graph of FIG. 5 as 1AVT.

Next, values of ¼AVT, of ½AVT, of 2AVT, and of 4AVT are determined. An outer pair of the time values indicated on FIG. 5 (i.e., the values of time indicated as ¼AVT and as 4AVT) are identified as values of time indicative of "shorts" and "opens", respectively. That is, if a particular memory cell is selected, and if the time interval measured is less than ¼AVT then the memory cell is considered to be shorted and to be bad. On the other hand, if the time interval measured is greater than 4AVT, then the memory cell is considered to be open-circuited, and is also bad. Bad memory cells are not used in testing for proper calibration of the sense amplifiers of the amplifier array 44.

Again, it will be understood that other values of the "shorts" and "opens" test limit values may be utilized.

However, the selected and preferred values are powers of 2, and are easily implemented digitally. Further, these selected values for the test limits have been shown by actual testing of the invention to provide very reliable operation for the MRAM chip 40.

Further, an additional pair of time intervals (i.e., ½AVT and 2AVT) are designated, and are indicated as recalibration high/recalibration low (Recal Hi/Lo) limit values. These Recal Hi/Lo values are the values within (i.e., between) which the time interval for a particular selected memory cell which is to be sensed must fall in order to indicate that the sense amplifier which will sense this memory cell has a proper calibration in view of the environmental factors then effective on the memory cell array 12. That is, the operating voltage Vdd of the MRAM chip 40 may have drifted, or the temperature of the memory cell array 12 may have changed so that the resistance of the memory cells and other circuit elements of the chip 40 is changed. The result is that if the time interval for the particular memory cell falls within the range from ½AVT to 2AVT, then the memory cell will be sensed, it is anticipated that the sensing result may be relied upon, and a recalibration of the sense amplifiers of array 44 will not be initiated. On the other hand, if the time interval for the selected memory cell does not fall in the range from ½AVT to 2AVT, but instead falls into one of the two "recalibrate" time interval ranges from ¼AVT to ½AVT, or from 2AVT to 4AVT, then the sense amplifiers for array 44 are recalibrated.

That is, if a "shorts" or "opens" condition is detected, then the recalibration test result is ignored. A shorted or open-circuited memory cell will not trigger a recalibration of the sense amplifiers of array 44. Similarly, a shorted or opened memory cell will not have been used by the controller circuit 46 to store a data bit. However, if a "shorts" or "opens" condition is not detected, then the results of the testing of the memory cell's resistance are compared to the Recal Hi/Lo limits. So long as the cell's resistance is indicated to be within (i.e., between) the pair of Recal Hi/Lo limits, then sensing of the memory cell proceeds, and no recalibration of the sense amplifier for that memory cell is initiated. On the other hand, if the Recal Hi/Lo limits are exceed (i.e., meaning that the sensed cell's "time value" is either below ½AVT, or above 2AVT, but not less than ¼AVT or more than 4AVT) then sensing of the memory cell stops, data stored in the memory cell is preserved undisturbed, a sense amplifier recalibration is initiated, and the data stored in the memory cell is sensed later after completion of this sense amplifier recalibration.

Figure 6:
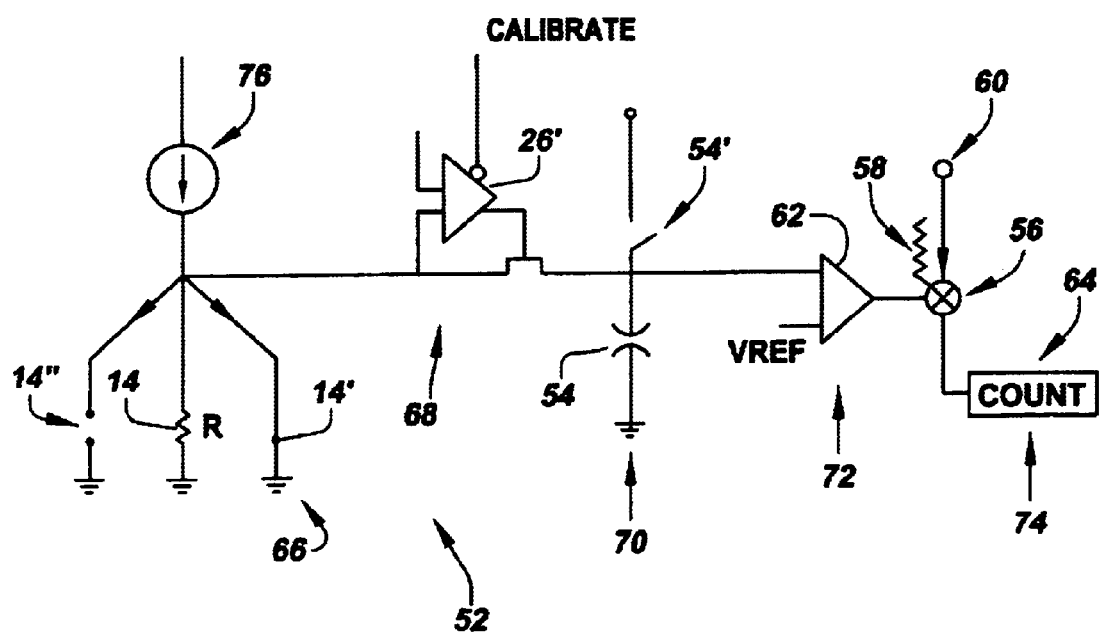
FIG. 6 illustrates a generalized schematic of a circuit that may be utilized in the method of sensing a memory cell in a resistive cross point memory cell array.

Considering now FIG. 6, an example implementation of a circuit portion 52 of the calibration controller 50 is illustrated. This circuit portion 52 may be termed an individual sense amplifier portion, and is switched into connection with a particular memory cell at the same time as the sense amplifier 26, which is used to sense that memory cell. In fact, the circuit portion 52 and sense amplifier 26 may share circuit elements, as will be clear in view of the explanation below. The circuit portion 52 includes a selected RXPtM cell 14, a capacitance 54 with a charging switch 54', a comparator amplifier 26', and a switching junction 56 (i.e., switched either opened or closed) that is controlled by a voltage comparator circuit 62. Further, the number of clock pulses which pass through junction 56 while the junction 56 is switched closed is recorded in a counter 64 for data sensing and calibration uses.

Also included in the illustration of FIG. 6 (which will be recalled to be a schematic circuit diagram) is an indication of the location and effect of a shortened memory cell (i.e., indicated with a reference numeral 14'), and of an open memory cell (indicated with a reference numeral 14"). The reference numerals 14' and 14" seen on FIG. 6 are provided merely so that the reader will have an appreciation of the location and effect of either a shorted or open memory cell. A shorted or open resistive memory cell will be indicative of the time values obtained for such shorted and open memory cells. That is, the count value stored in counter 64 is indicative of a particular time interval as is graphically depicted on FIG. 5, so that the time values ¼AVT, ½AVT, 1AVT, 2AVT, and 4AVT are indicated according to a stored digital value in counter 64. Thus, a comparison of the digital value of actual clock counts stored in counter 64 to the counts for these time intervals determines whether a time value for the memory cell 14 under the then existing environmental factors for the MRAM chip 40, and with the existing calibration of sense amplifier 26 is acceptable. If the time value is acceptable, then the count value in counter 64 is stored for use as an indication (i.e., in view of a further test) of the binary value ("1" or "0") stored in the cell 14 being sensed.

With reference to FIG. 6, it is seen that the circuit 52 includes a load model 66 for the resistive cross point memory cell. This load model may be considered to be representative of the particular resistive cross point memory cell being sensed. Again, this resistive cross point memory cell may be shorted, may be open, or may have a normal resistance. However, if the resistive cross memory cell being sensed has a normal resistance, then the sense amplifier 26 may have an acceptable calibration, or may require recalibration before the sensing operation is completed.

The comparator amplifier 26' is a constant voltage pre-amplifier (indicated generally with numeral 68), which effectively isolates the resistance R (i.e., resistance 14) from the integrator circuit 70. The comparator amplifier 26' behaves as a current source while maintaining a constant voltage across the resistance 14 of the resistive cross point memory cell being sensed.

An integrator 70 includes the switch 54', the capacitor 54, and a ground connection. This integrator 70 allows the load current (i.e., sneak path current plus current through the load resistor R (i.e., resistor 14)) to discharge the capacitor 54. The rate of decay of the voltage at the integrator 70 is a direct function of the load current. If the load is shorted (i.e. 14') then the pre-amp current will be very high and the integrator 70 will discharge very quickly. If the load is open (i.e., 14"), then the integrator 70 will discharge at a rate determined by the sneak path currents and by the circuit design and the discharge time will be relatively large. A normally resistive cross point memory cell (i.e., resistance 14) will cause the discharge time to fall within the range explained above.

Comparator section 72 includes the comparator circuit 62, and a connection to a reference voltage source (see on FIG. 6). The comparator 62 controls the switching junction 56 to open (i.e., switch closure) at the beginning of the integration period, and to close (i.e., switch opening) at the time when the voltage from capacitor 54 equals Vref.

The circuit 52 also includes the counter 64 and storage circuit 74, which includes switching junction 56, a connection to a clock pulse source (indicated at 60) and the counter 64. The result of the stored count value at counter 64 is compared to the reference values (i.e., ¼AVT, ½AVT, 1AVT, 2AVT, and 4AVT) as described above, in order to determine if recalibration of the sense amplifier 26 is or is not necessary.

Finally, it is seen that the circuit 52 includes a representation at 76 of a current source, providing a current (which is a parasitic current) also flowing through the resistance of cell 14. The current source 76 is representative of sneak path currents resulting through the other resistive cells of a cell array, and realized at a particular cell 14 under evaluation.

Again, if the count value of counter 64 does not fall within the range of ½AVT to 2AVT (i.e., as explained above, in accordance with this preferred embodiment), then the sense operation is suspended, and the sense amplifier 26 is recalibrated before sensing of the cell 14 continues (provided that the cell does not give a "short" or "open" value—recalling the additional indications 14' and 14" of FIG. 6).

When the time value for cell 14 falls within the acceptable range from ½AVT to 2AVT (i.e., either before or after recalibration of the sense amplifier 26) then the cell is further sensed by writing either a zero ("0") or a one ("1") value to the cell, and sensing its resistance value with the same calibration of sense amplifier 26. Subsequently, the other of a zero ("0") or one ("1") value is written in the cell 14 and is sensed again with the same calibration of sense amplifier 26.

Each of these sensing steps gives a count value in counter 64, which is sensed and stored. A comparison between the first sensing count and the second sensing count, and between the first sensing count and the third sensing count, provides an unambiguous indication of which value of value (i.e., zero ("0") or one ("1")) was originally stored in the selected memory cell 14. This determined value of zero ("0") or one ("1") is then written back into cell 14 to complete the sense process for the memory cell 14. Thus, the above sensing process includes three sensing steps, each alternating with three writing steps. Further, in the event that recalibration of the sense amplifier is necessary, this necessity is determined at the first sensing step before the first writing step, and the sense amplifier is then recalibrated. After this recalibration, the triple sense and triple write operation is performed.

The identities of data values stored in each memory cell 14 of an array 12 are verified by the disclosed method contemporaneously with sensing a resistance value indicative of the stored value. That is, a triple sense and triple write process is performed, with the first step in the process (i.e., the first sense step) being carried out contemporaneously with a test to determine that the particular memory cell and its associated sense amplifier have a proper calibration in view of then existing environmental factors. If not, then the sensing operation is suspended, and the sense amplifiers are all recalibrated. When the calibration factors are within an acceptable range determined by a time factor for a cell to be sensed that falls within the range from ½AVT to 2AVT then the sensing operations continue. Because this method is carried out each time data is to be sensed from a memory cell, the data sensed from the cells of the array 12 is more likely to be valid.

Figure 7A:
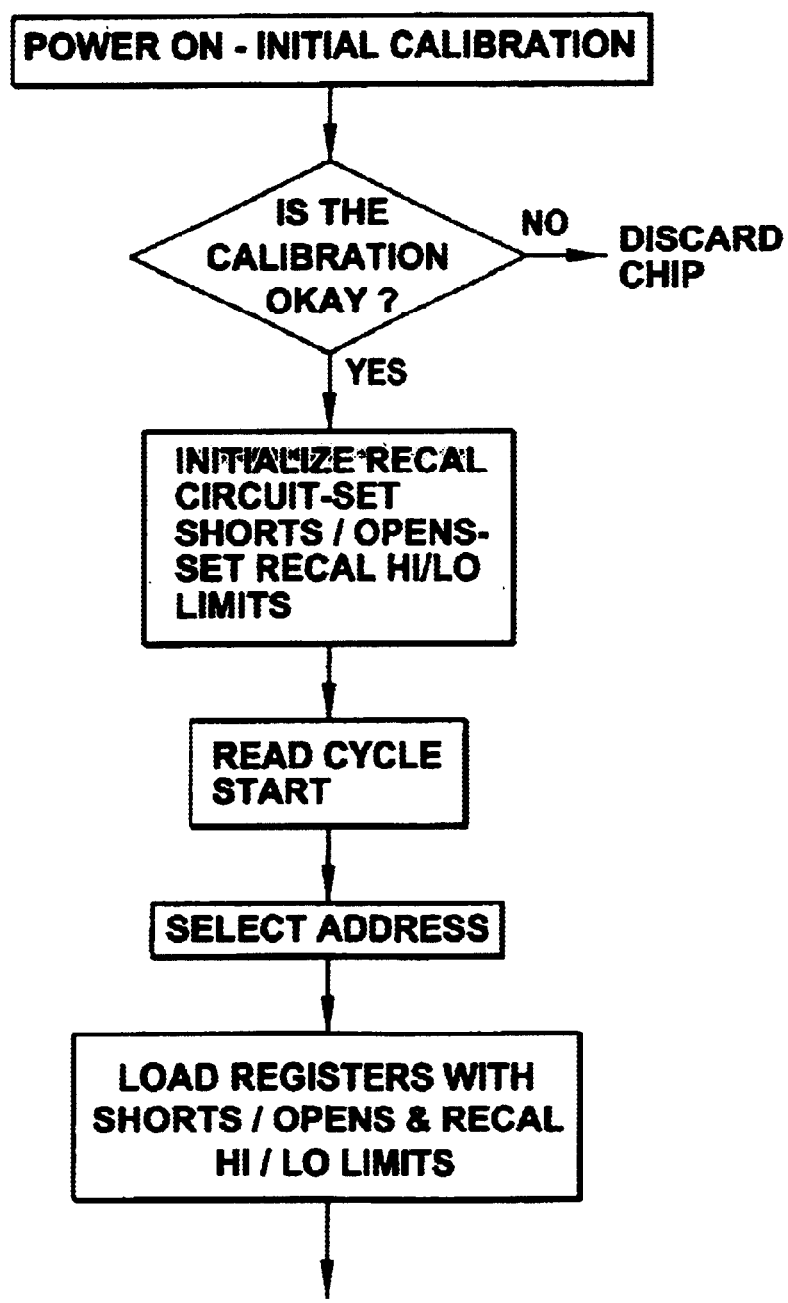
FIGS. 7a and 7b is a flowchart illustrating a method of sensing a memory cell of a MRAM memory cell array, while contemporaneously testing for proper amplifier calibration.
Figure 7B:
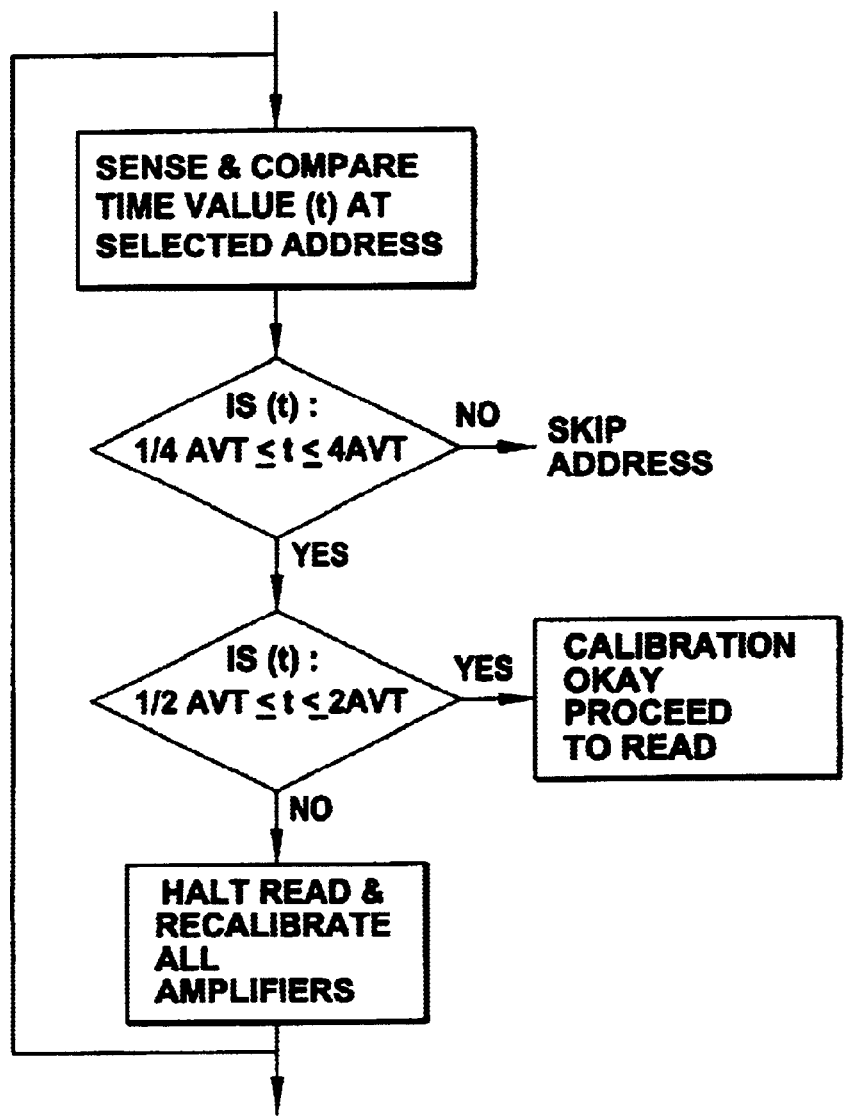
Figure 8:
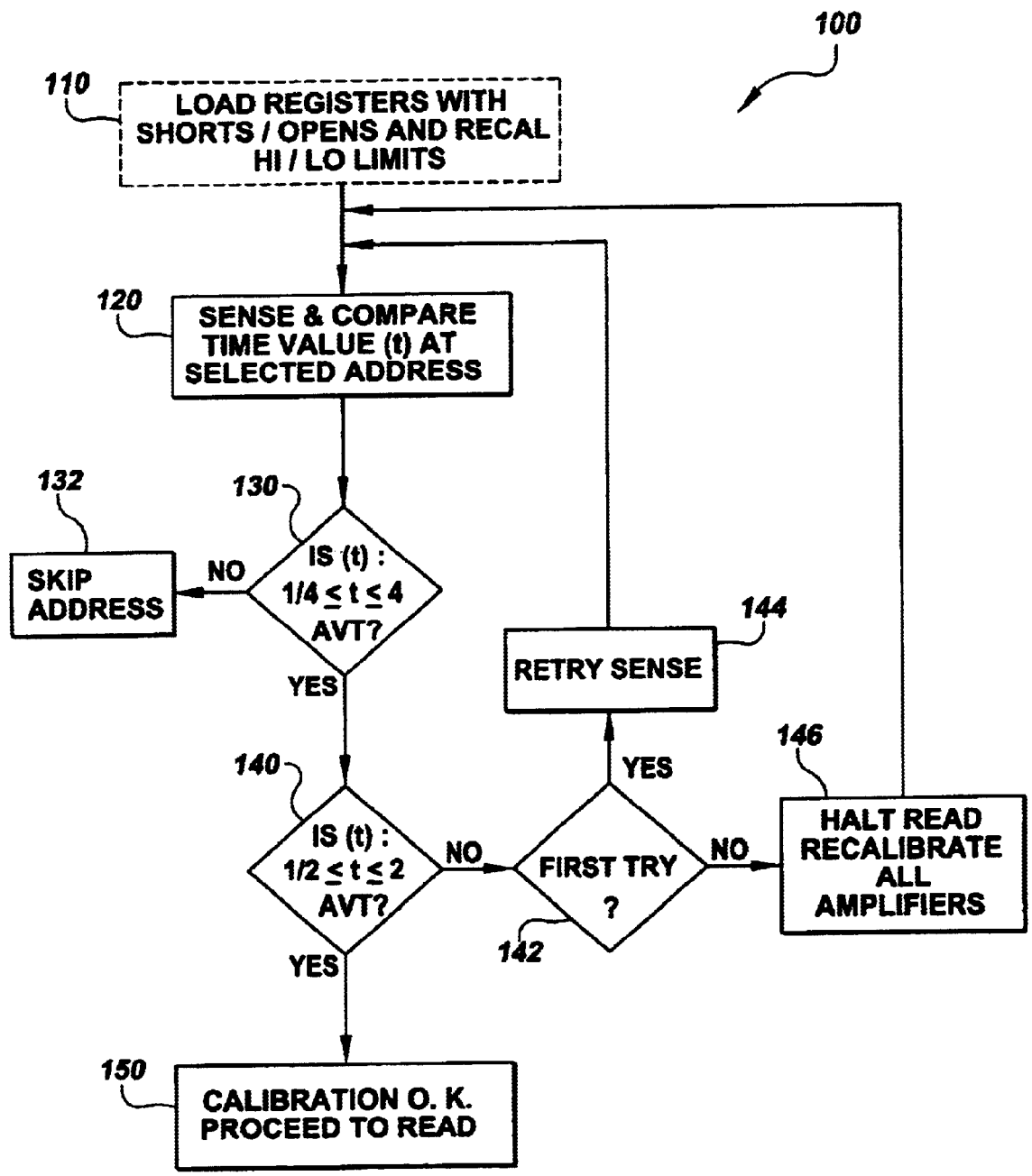
FIG. 8 is a flowchart illustrating another method of testing for proper amplifier calibration.

FIG. 8 is a flowchart illustrating an alternative method 100, diverging from that disclosed in U.S. Pat. No. 6,504,779, for sensing and recalibrating. The method 100 is similar to the method of FIGS. 7a and 7b up until the first sense of a selected cell. That is, the steps of initializing the recalibration circuit, setting the "short" and "open" and Recal Hi/Lo limits, selecting the address, and loading the registers with the "short" and "open" and Recal Hi/Lo limits, are substantially similar. These steps are incorporated into the block labeled 110 of FIG. 8.

The method 100 proceeds from this point forward, with sensing a selected memory cell and comparing its value to the stored limits (step 120). If it is detected that the sense falls outside the ¼AVT and 4AVT range thereby signifying a "short" or "open," (step 130) that sense is disregarded and the selected address is skipped (step 132). If the sense is within that range, the method 100 proceeds to step 140 where it is determined if the sense is within the ½AVT and 2AVT range (the Recal Hi/Lo limits). If the sense is within this more defined range, the calibration is considered acceptable, and the complete sensing operation proceeds (step 150).

If it is determined that that sense is not within the Recal Hi/Lo limits, a verification is performed to determine whether the sense has been retried (step 142). A register may be set to store this information. If it is determined that it has not been retried yet, a retry of the sense may be performed (step 144), which incorporates the process of repeating steps 120 and on. The register, or some other indicator, is then set to indicate a retry has been performed. A retry may correct for any false negatives. Therefore, if the retry determines the sense is within the Recal Hi/Lo limits (step 140 repeated), the complete sensing operation will proceed (step 150).

If it is determined that a retry had already been performed and the retry sense was not within the Recal Hi/Lo limits, then the recalibration process, similar to that previously discussed (step 146), is performed to correct for the process and other variations.

One advantage of performing a retry of the sense prior to committing to the recalibration is that it increases the overall performance time of the method 100. The recalibration step, in and of itself, may take a substantial amount of time. A retry to the sense may correct for some marginal senses that could produce a false negative. Marginal senses that produce false negative reads can be caused by transient effects on the selected cell, such as varying voltage and/or current, or a noise spike. If a retry sense is performed on the selected cell, these transients would likely be avoided, thus eliminating the false negative sense and avoiding the potentially time consuming recalibration step.

It is noted that, although the method 100 includes only one retry, more than one retry can be performed. The only variation required would be the element that stored and counted the number of retries performed. However, multiple retries may produce diminishing returns as each retry would take some amount of time, that, if repeated, would amount for the time in which the retrying was attempting to eliminate (namely the recalibration time). It is also noted that the comparing of the sense against the "short" and "open" limits (step 130) could also utilize a retry iteration to correct for any false negatives produced in that test.

Generally the methods of FIGS. 7a, 7b and 8 may be performed with a combination of software and hardware. For example, an application specific integrated circuit (ASIC) may be configured to perform the comparison steps and control the recalibration, re-sensing, etc. Essentially, the sensing of a particular memory cell is performed by the circuit 52 of FIG. 6 and stores a measurement of a parameter of the memory cell in the counter 74. A simple control circuit, such as an ASIC, may be programmed to compare the value stored in the counter 74 to the "short" and "open" limits, as well as the Recal Hi/Lo limits. The same circuit can thus initiate re-sensing, if necessary, or initiate the procession of the full read. Likewise, this circuit can track the number of iterations of re-sensing performed, i.e. steps 142 and 144 of FIG. 8. As mentioned, the number of iterations of re-sensing would preferably be one and so can be tracked with a simple one-bit counter.

The methods of FIGS. 7a and 7b and FIG. 8, as mentioned, could also be performed in software. It will be appreciated that the various software and/or firmware programs comprise an ordered listing of executable instructions for implementing logical functions and can be embodied in any computer-readable medium for use by or in connection with an instruction execution system, apparatus, or transmission device, such as a computer-based system, processor-containing system, or other system that can fetch the instructions from the instruction execution system, apparatus, or device and execute the instructions. In the context of this document, a "computer-readable medium" can be any means that can contain, store, communicate, propagate, or transport the program for use by or in connection with the information system, apparatus, or device. The computer readable medium can be, for example but not limited to, an electronic, magnetic, optical, electromagnetic, infrared, or semiconductor system, apparatus, device, or propagation medium. More specific examples (a non-exhaustive list) of the computer-readable media would include the following: an electrical connection (electronic) having one or more wires, a portable computer diskette (magnetic), a random access memory (RAM) (electronic), a read-only memory (ROM) (electronic), an erasable programmable read-only memory (EPROM or Flash memory) (electronic), an optical fiber (optical), and a portable compact disc read-only memory (CDROM)(optical). Note that the computer-readable medium could even be paper or another suitable medium upon which the program is printed, as the program can be electronically captured, via for instance optical scanning of the paper or other medium, then compiled, interpreted or otherwise processed in a suitable manner if necessary, and then stored in a computer memory.

What is claimed is:

1. A method for recalibrating a sense amplifier during a sense of a selected memory cell, comprising:
measuring a physical property of the selected memory cell to produce a first measurement;
comparing the first measurement to a first range, wherein the first range is indicative of a short circuit or an open in the selected memory cell;
halting the sense of the selected memory cell if the first measurement exceeds the first range;
comparing the first measurement to a second range, wherein the second range is a predetermined range signifying a recalibration of the sense amplifier may be necessary,
proceeding with the sense if the first measurement is within the first range and the second range;
repeating the steps of measuring and comparing for a predetermined number of iterations, if after each iteration, the measurement exceeds the second range but is within the first range; and
recalibrating the sense amplifier, if after the predetermined number of iterations, the measurement still exceeds the second range but is within the first range.

2. The method of claim 1, wherein the predetermined number of iterations is one.

3. The method of claim 1, wherein the measured physical property is any one of the following: voltage, current, power dissipation, time to discharge, and time to charge.

4. The method of claim 1, further comprising:
incrementing a counter after each iteration, wherein the counter stores the number of completed iterations.

5. The method of claim 1, further comprising:
repeating the steps of measuring and comparing for a second predetermined number of iterations, if after each iteration the measurement exceeds the first range; and
halting the sense, if after the second predetermined number of iterations the measurement still exceeds the first range.

6. A method for testing for needed recalibration of a sense amplifier during a sense of a resistance value of a selected memory cell, the method comprising:
defining an average time value indicative of averaged time values for each of a selected set of memory cells, wherein the resistance of each cell of the selected set of cells is connected in series with a selected pre-charged capacitance, and with present operating parameters of the memory cell array applying;
determining a time value indicative of the discharge time of the selected capacitance upon connection to the resistance of the selected memory cell;
calculating a difference value by comparing the time value to the average time value;
halting the sense of the selected memory cell if the difference value exceeds a first range;
redetermining the time value and recalculating the difference value if the difference value is within the first range but exceeds a second range;
recalibrating the sense amplifier if the recalculated difference value still exceeds the second range; and
proceeding with the sense operation if the difference value or the recalculated difference value is within the second range.

7. The method of claim 6, wherein the step of redetermining the time value and recalculating the difference value is performed one time before the step of calibrating is performed.

8. The method of claim 6, wherein the step of redetermining the time value and recalculating the difference value is performed at least one time before the step of calibrating is performed.

9. A method for increasing the quality of sensing during a read on a memory cell, the method comprising:
sensing a parameter of the memory cell;
comparing the parameter to a threshold to determine whether the parameter is valid;
enabling a sensing procedure upon determining the parameter is valid; and
enabling a response procedure upon determining the parameter is not valid.

10. The method of claim 9, wherein the response procedure comprises:
halting the read; and
facilitating recalibration of sensing equipment configured to perform the sensing.

11. The method of claim 10, wherein the response procedure further comprises:
reattempting the sense prior to recalibration of the sensing equipment to test for false negatives.

12. The method of claim 10, wherein the response procedure further comprises:
reattempting the read upon recalibration.

13. The method of claim 9, wherein the sensing procedure is a triple-sensing destructive read procedure.

14. The method of claim 9, wherein the memory cell is a memory cell of a magnetoresistive random access memory (MRAM) device.

15. The method of claim 9, wherein the parameter is the resistance of the memory cell.

16. The method of claim 9, wherein comparing the parameter to a threshold comprises:

comparing the parameter to a variable threshold.

17. A sensing system for sensing a state of a memory cell, the system comprising:

means for sensing a parameter of the memory element;

means for comparing the parameter to a first range to determine whether the parameter is valid;

means for performing a sensing procedure upon determining the parameter is valid; and means for performing a response procedure upon determining the parameter is not valid.

18. The system of claim 17, wherein the means for performing the response procedure comprises:

means for comparing the parameter to a second range, whereby the second ranges indicates an erroneous memory cell;

means for initiating the means for sensing to repeat sensing of the memory cell; and means for facilitating recalibration of the means for sensing if the repeat sensing of the memory cell determines the sensing to still be invalid.

19. The system of claim 18, further comprising:

means for tracking a number of iterations of sensing and re-sensing performed by the means for sensing; and means for terminating re-sensing upon reaching a predetermined number of iterations of re-sensing.

20. A program for sensing a state of a memory element, the program being stored on a computer-readable medium, the program comprising:

logic configured to enable sensing of a parameter of the memory element;

logic configured to compare the parameter to a first range and second range to determine whether the parameter is valid;

logic configured to enable a sensing procedure upon determining the parameter is valid;

logic configured to re-enable sensing of the parameter of the memory element upon determining the parameter is invalid; and logic configured to facilitate recalibration of sensing equipment configured to perform the sensing, upon re-sensing the parameter for a predetermined number of iterations.

* * * * *

UNITED STATES PATENT AND TRADEMARK OFFICE
CERTIFICATE OF CORRECTION

PATENT NO.         : 6,898,134 B2                                   Page 1 of 1
APPLICATION NO.    : 10/623357
DATED              : May 24, 2005
INVENTOR(S)        : Kenneth Smith et al.

It is certified that error appears in the above-identified patent and that said Letters Patent is hereby corrected as shown below:

In column 5, line 9, after "for" insert -- orienting the magnetization of selected memory cells 14 during write operations. The sense --.

In column 11, line 45, in Claim 1, delete "necessary," and insert -- necessary; --, therefor.

Signed and Sealed this

Twenty-seventh Day of October, 2009

David J. Kappos
*Director of the United States Patent and Trademark Office*